(12) United States Patent
Hsieh et al.

(10) Patent No.: US 8,462,509 B2
(45) Date of Patent: Jun. 11, 2013

(54) HEAT-DISSIPATING MODULE AND ELECTRONIC DEVICE USING SAME

(75) Inventors: Yi-Hwa Hsieh, Taoyuan Hsien (TW); Yao-Cheng Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 253 days.

(21) Appl. No.: 13/035,720

(22) Filed: Feb. 25, 2011

(65) Prior Publication Data
US 2011/0222246 A1    Sep. 15, 2011

(30) Foreign Application Priority Data

Mar. 11, 2010    (TW) .............................. 99107034 A (51) Int. Cl.
*H05K 7/20*    (2006.01)
(52) U.S. Cl.
USPC ........................................................ 361/720
(58) Field of Classification Search
None
See application file for complete search history.

(56) References Cited

U.S. PATENT DOCUMENTS

| | | | | |
|---|---|---|---|---|
| 5,204,805 A * | 4/1993 | Takahashi et al. | ............ | 361/720 |
| 5,381,304 A * | 1/1995 | Theroux et al. | ................ | 361/706 |
| 5,675,223 A * | 10/1997 | Yoshizawa et al. | ........... | 318/139 |
| 5,828,549 A * | 10/1998 | Gandre et al. | ................ | 361/695 |
| 5,835,350 A * | 11/1998 | Stevens | .......................... | 361/704 |
| 6,034,874 A * | 3/2000 | Watanabe | ..................... | 361/704 |
| 6,091,604 A * | 7/2000 | Plougsgaard et al. | ........ | 361/707 |
| 6,320,748 B1 * | 11/2001 | Roden et al. | ................... | 361/704 |
| 6,441,520 B1 * | 8/2002 | Grant | ............................ | 310/68 R |
| 6,519,154 B1 * | 2/2003 | Chiu | ............................... | 361/704 |
| 6,625,027 B2 * | 9/2003 | Rider et al. | ..................... | 361/706 |
| 6,627,989 B2 * | 9/2003 | Kohno et al. | ................... | 257/706 |
| 6,894,906 B2 * | 5/2005 | Sivertsen | ....................... | 361/796 |
| 6,903,936 B2 * | 6/2005 | Lin | ................................. | 361/752 |
| 6,977,815 B2 * | 12/2005 | Hsu | ................................ | 361/704 |
| 7,056,144 B2 * | 6/2006 | Barsun et al. | .................. | 439/362 |
| 7,165,604 B2 * | 1/2007 | Huang | ............................ | 165/121 |
| 7,310,225 B2 * | 12/2007 | Ha et al. | ......................... | 361/688 |
| 7,365,972 B2 * | 4/2008 | Chen et al. | ............... | 361/679.41 |
| 7,450,387 B2 * | 11/2008 | Cheng et al. | ................... | 361/704 |
| 7,742,307 B2 * | 6/2010 | Ellsworth et al. | .............. | 361/720 |
| 7,791,888 B2 * | 9/2010 | Tominaga et al. | ............. | 361/708 |
| 7,876,561 B2 * | 1/2011 | Schnetzka et al. | ............ | 361/699 |
| 8,220,878 B2 * | 7/2012 | Yoshinaga et al. | .......... | 303/119.3 |
| 2002/0006027 A1 * | 1/2002 | Rodriguez et al. | ............ | 361/688 |
| 2002/0172008 A1 * | 11/2002 | Michael | ......................... | 361/697 |
| 2003/0016502 A1 * | 1/2003 | Yamada et al. | ................ | 361/705 |
| 2004/0218372 A1 * | 11/2004 | Hamasaki et al. | ............. | 361/767 |
| 2005/0024838 A1 * | 2/2005 | Maxwell | ........................ | 361/782 |
| 2005/0088831 A1 * | 4/2005 | Lin | ................................. | 361/752 |
| 2006/0164812 A1 * | 7/2006 | Ha et al. | ......................... | 361/709 |
| 2007/0139896 A1 * | 6/2007 | Yamada et al. | ................ | 361/720 |
| 2007/0206361 A1 * | 9/2007 | Cheng et al. | ................... | 361/719 |

(Continued)

*Primary Examiner* — Hoa C Nguyen
*Assistant Examiner* — Xanthia C Cunningham
(74) *Attorney, Agent, or Firm* — Kirton McConkie; Evan R. Witt (57) ABSTRACT

A heat-dissipating module for use in an electric device includes a circuit board, at least one heat-generating element, and at least one heat-conducting element. The circuit board has a first surface, a second surface and at least one perforation. The heat-conducting element is disposed in the perforation. The heat-conducting element includes a base and a sidewall. The heat-generating element is disposed on the base or the sidewall of the heat-conducting element so that the heat by the heat-generating element is conducted to the second surface of the circuit board through the heat-conducting element.

19 Claims, 5 Drawing Sheets

U.S. PATENT DOCUMENTS

| | | | |
|---|---|---|---|
| 2007/0215316 A1* | 9/2007 | Saito et al. | 165/41 |
| 2008/0030961 A1* | 2/2008 | Koo et al. | 361/720 |
| 2008/0068810 A1* | 3/2008 | Watanabe | 361/720 |
| 2008/0158824 A1* | 7/2008 | Aoki et al. | 361/711 |
| 2008/0285224 A1* | 11/2008 | Odanaka et al. | 361/683 |

* cited by examiner

HEAT-DISSIPATING MODULE AND ELECTRONIC DEVICE USING SAME

FIELD OF THE INVENTION

The present invention relates to a heat-dissipating module and an electronic device, and more particularly to a heat-dissipating module configured to be used in a relatively high environment temperature for dissipating heat and an electronic device using the heat-dissipating module.

BACKGROUND OF THE INVENTION

Fossil fuels such as petroleum and coal are widely used in automobiles or power plants for generating motive force or electrical power. As known, burning fossil fuels produces waste gases and carbon oxide. The waste gases may pollute the air. In addition, carbon dioxide is considered to be a major cause of the enhanced greenhouse effect. It is estimated that the world's oils supply would be depleted in the next several decades. The oil depletion may lead to global economic crisis.

Consequently, there are growing demands on clean and renewable energy. Recently, electric vehicles and hybrid electric vehicles have been researched and developed. Electric vehicles and hybrid electric vehicles use an electrical generator to generate electricity. In comparison with the conventional gasoline vehicles and diesel vehicles, the electric vehicles and hybrid electric vehicles are advantageous because of low pollution, low noise and better energy utilization. The uses of the electric vehicles and hybrid electric vehicles can reduce carbon dioxide emission in order to decelerate the greenhouse effect.

As known, a power supply (e.g. an AC-to-DC charger or a DC-to-DC converter) is an essential component of the electric vehicle and the hybrid electric vehicle. The power supply of the electric vehicle or the hybrid electric vehicle is usually installed on the front side or rear side of the vehicle body. Since the space for accommodating the power supply of the electric vehicle is not exposed to the surrounding and the power consumption of the power supply is very high, the heat generated by the power supply is readily accumulated. In this situation, the environmental temperature of the power supply is increased (e.g. up to 85° C.). For reducing the adverse influence of the high environmental temperature, the power supply needs to have a suitable heat-dissipating mechanism.

In addition, for meeting the safety regulations, the power supply is usually designed as a sealed device to achieve a waterproof and dustproof purpose. It is critical to conduct and dissipate the heat generated by the electronic components of the sealed power supply under the stringent conditions.

As known, the power supply includes various kinds of heat-generating electronic components. Since the dimensions, locations and heights of these electronic components are somewhat different, it is difficult to uniformly and efficiently dissipate the heat. It is necessary for providing a heat-dissipating mechanism to uniformly and efficiently dissipate the heat.

Therefore, there is a need of providing a heat-dissipating module and an electronic device using the heat-dissipating module to uniformly and efficiently transfer the heat generated by the heat-generating electronic components inside the power supply toward the outside so that the drawbacks encountered from the prior art can be obviated.

SUMMARY OF THE INVENTION

It is an object of the present invention to provide a heat-dissipating module and an electronic device using the heat-dissipating module for well heat conducting and dissipating from the sealed device while achieving the waterproof and dustproof purposes under the stringent surroundings.

In accordance with an aspect of the present invention, there is provided a heat-dissipating module for use in an electric device. The heat-dissipating module includes a circuit board, at least one heat-generating element and at least one heat-conducting element. The circuit board has a first surface, a second surface and at least one perforation. The heat-conducting element is disposed in the perforation. The heat-conducting element includes a base and a sidewall. The heat-generating element is disposed on the base or the sidewall of the heat-conducting element so that the heat by the heat-generating element is conducted to the second surface of the circuit board through the heat-conducting element.

In accordance with another aspect of the present invention, there is provided an electric device disposed in a sealed accommodating space. The electric device includes a casing, a heat-dissipating module and a cold plate. The heat-dissipating module includes a circuit board, at least one heat-generating element and at least one heat-conducting element. The circuit board is disposed in the casing and has a first surface, a second surface and at least one perforation. The heat-conducting element is disposed in the perforation, wherein the heat-conducting element comprises a base and a sidewall. The cold plate is disposed under the circuit board. The heat-generating element is disposed on the base or the sidewall of the heat-conducting element so that the heat by the heat-generating element is transmitted to the cold plate through the heat-conducting element.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
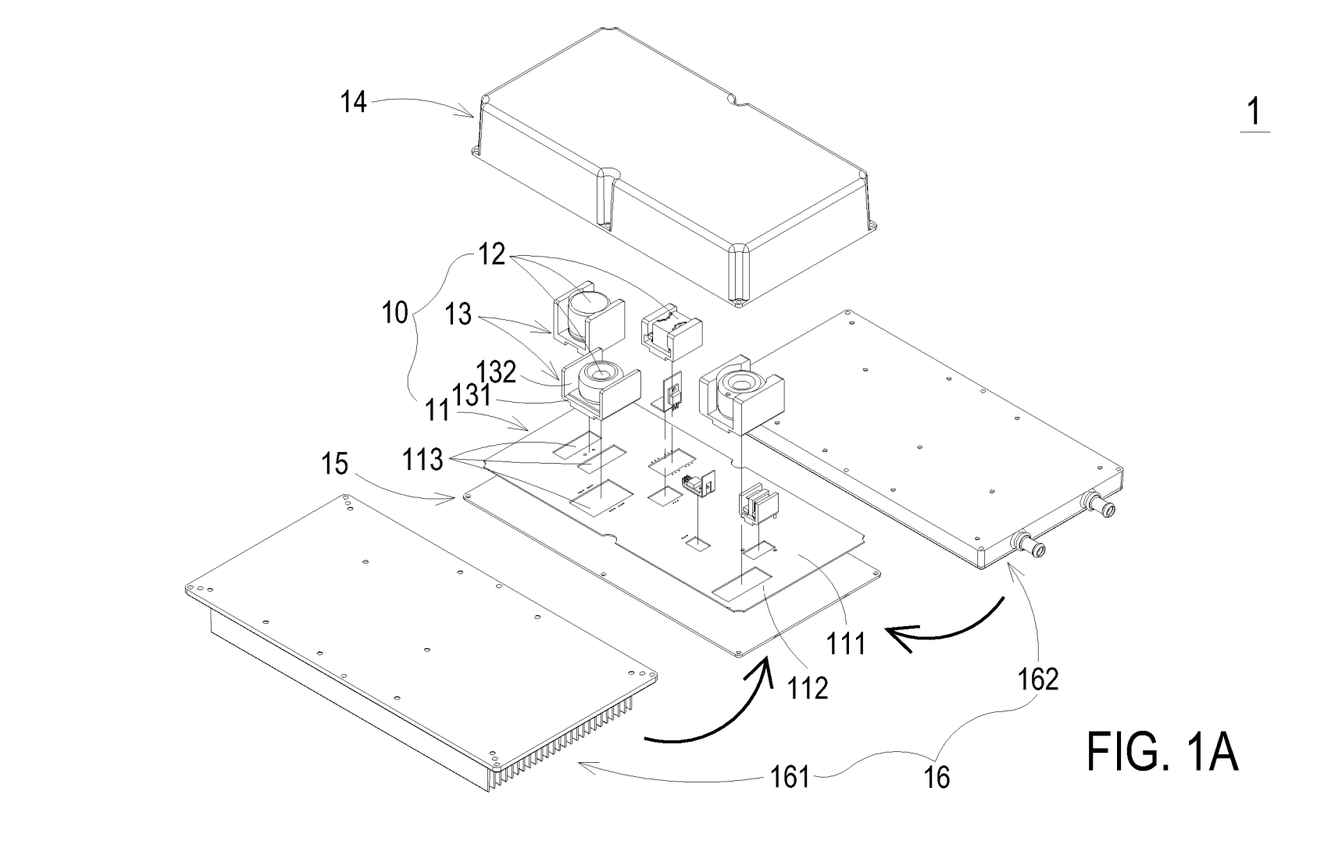
FIG. 1A is a schematic exploded view illustrating a heat-dissipating module for use in an electronic device according to an embodiment of the present invention.

FIG. 1A is a schematic exploded view illustrating an electronic device according to an embodiment of the present invention. As shown in FIG. 1A, the heat-dissipating module 10 is employed in an electronic device 1 and includes a circuit board 11, plural heat-generating elements 12 and plural heat-conducting elements 13 corresponding to the heat-generating elements 12. The circuit board 11 has a first surface 111, a second surface 112 and plural perforations 113. The perforations 113 run through the first surface 111 and the second surface 112. Each of the heat-conducting elements 13 comprises a base 131 and a sidewall 132. A corresponding heat-generating element 12 is in contact with the base 131 and/or the sidewall 132 of the heat-conducting element 13. The heat-conducting element 13 is inserted into a corresponding perforation 113 of the circuit board 11. Thereby, the heat generated by the heat-generating elements 12 will be conducted to a cold plate 15 through the bases 131 and the sidewalls 132 of the heat-conducting elements 13.

Figure 1B:
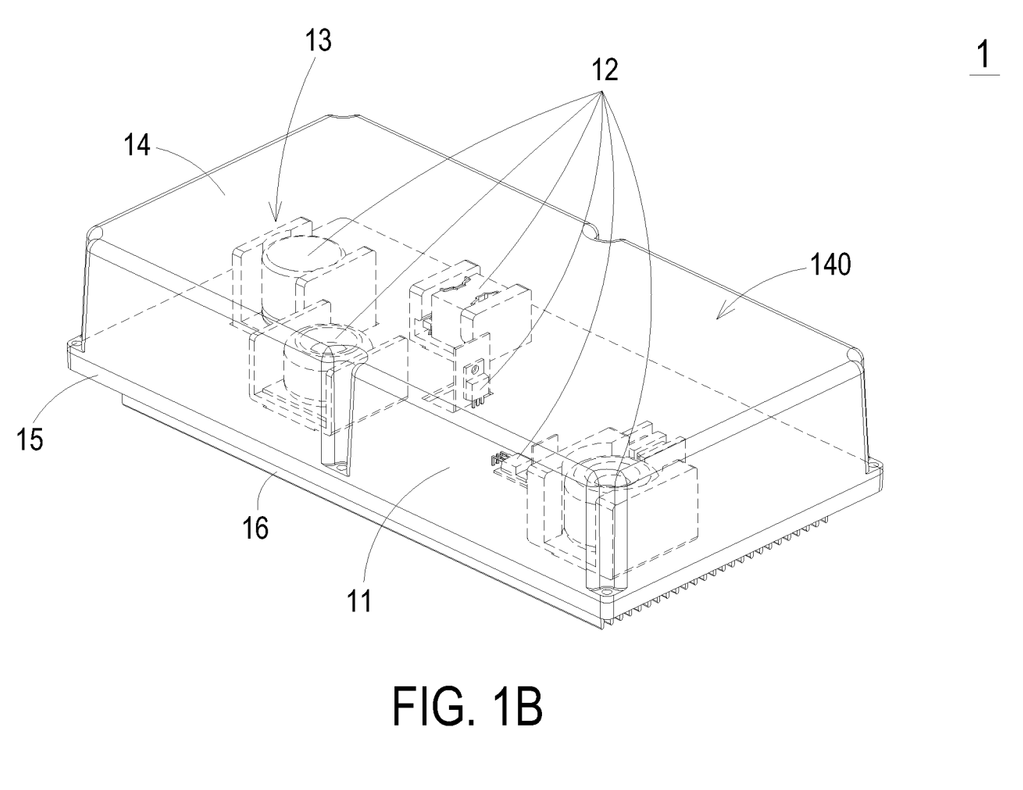
FIG. 1B is a schematic assembled view illustrating the electronic device of FIG. 1A.

FIG. 1B is a schematic assembled view illustrating the electronic device of FIG. 1A. As shown in FIGS. 1A and 1B, the electronic device 1 includes a heating-dissipating module 10, a casing 14, a cold plate 15 and an active heat-dissipating member 16. The heating-dissipating module 10 includes a circuit board 11, plural heat-generating elements 12, plural heat-conducting elements 13. An example of the electronic device 1 is a power supply such as an AC-to-DC charger or a DC-to-DC converter. The circuit board 11 is disposed within the casing 14. The cold plate 15 is disposed under the circuit board 11. In this embodiment, the cold plate 15 is a flat plate. The cold plate 15 is made of a material with high thermal conductivity (e.g. metallic material). The cold plate 15 is securely attached on the second surface 112 of the circuit board 11. The cold plate 15 and the casing 14 are combined together to define a sealed space 140 in order to achieve waterproof and dustproof purposes.

Please refer to FIGS. 1A and 1B again. The active heat-dissipating member 16 is disposed under the cold plate 15. After the heat generated by the heat-generating elements 12 is conducted to the circuit board 11 and the cold plate 15 through the heat-conducting elements 13, the heat will be dissipated away by the active heat-dissipating member 16 in an active heat-dissipating manner. As such, the electronic device 1 is cooled down. In an embodiment, the active heat-dissipating member 16 includes an air-cooling member 161. In another embodiment, the active heat-dissipating member 16 includes a liquid-cooling member 162. In other words, the air-cooling member 161 or the liquid-cooling member 162 may be selected to dissipate away the heat that is transferred from the cold plate 15. In some embodiment, the cold plate 15 and the active heat-dissipating member 16 are integrally formed.

Figure 2A:
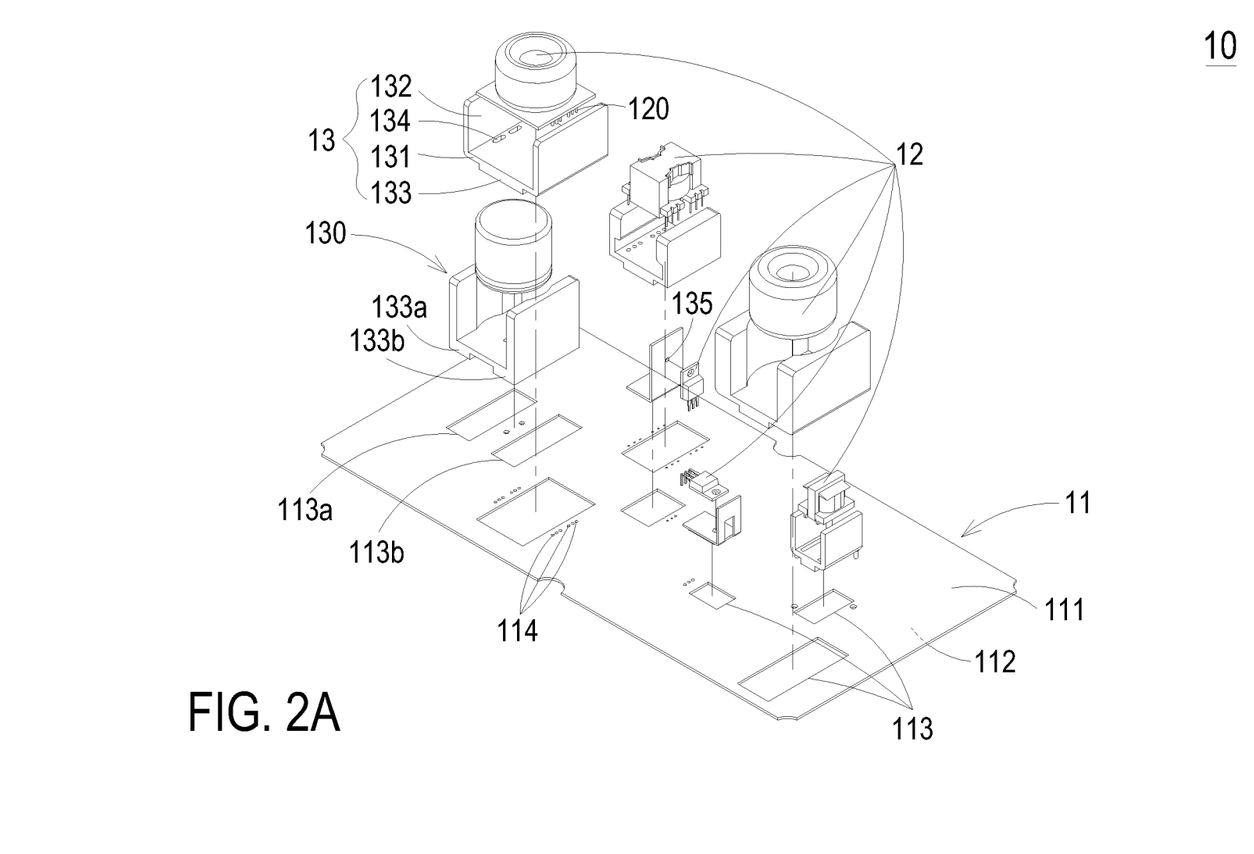
FIG. 2A is a schematic exploded view illustrating the relation between the circuit board, the heat-generating elements and the heat-conducting elements of the heat-dissipating module of the electronic device as shown in FIG. 1A.

FIG. 2A is a schematic exploded view illustrating the relation between the circuit board, the heat-generating elements and the heat-conducting elements of the heat-dissipating module of the electronic device as shown in FIG. 1A. Examples of the heat-generating elements 12 include but are not limited to transformers, inductors, capacitors, transistors or filters. The heat-generating elements 12 are disposed on the bases 131 of corresponding heat-conducting elements 13. In addition, the heat-conducting elements 13 are inserted into corresponding perforations 113 of the circuit board 11. The heat-conducting element 13 is made of a material with high thermal conductivity (e.g. metallic material).

Each of the heat-conducting elements 13 comprises a base 131 and at least one sidewall 132. Preferably, the heat-conducting element 13 has an L-shaped or U-shaped cross section. In some embodiments, the heat-conducting element 13 further includes at least one extension part 133. The extension part 133 is downwardly extended from the base 131 of the heat-conducting element 13. The cross-sectional area of the extension part 133 is substantially equal to the area of the corresponding perforation 113 so that the extension part 133 is inserted into the corresponding perforation 113. The profile and number of the extension parts 133 may be varied according to the practical requirements. For example, in a case that two extension parts 133a and 133b are downwardly extended from the heat-conducting element 130, the two extension parts 133a and 133b are inserted into two corresponding perforations 113a and 113b of the circuit board 11. As such, the heat by the heat-generating elements 12 could be conducted to the cold plate 15 through the heat-conducting elements 13. It is preferred that the base 131, the sidewall 132 and the extension part 133 of the heat-conducting element 13 are integrally formed.

Please refer to FIG. 2A again. Several apertures 134 are formed in the base 131 of the heat-conducting element 13. When a heat-generating element 12 is placed on a corresponding heat-conducting element 13, the pins 120 of the heat-generating element 12 are penetrated through corresponding apertures 134 and inserted into corresponding conductive holes 114 of the circuit board 11. Via the pins 120, the heat-generating element 12 is electrically connected with the circuit board 11. In some embodiments, the several fixing holes 135 are formed in the sidewall 132 of the heat-conducting element 13. By penetrating fastening elements (not shown) through corresponding fixing holes 135, a corresponding heat-generating element 12 can be fixed on the sidewall 132 of the heat-conducting element 13.

Figure 2B:
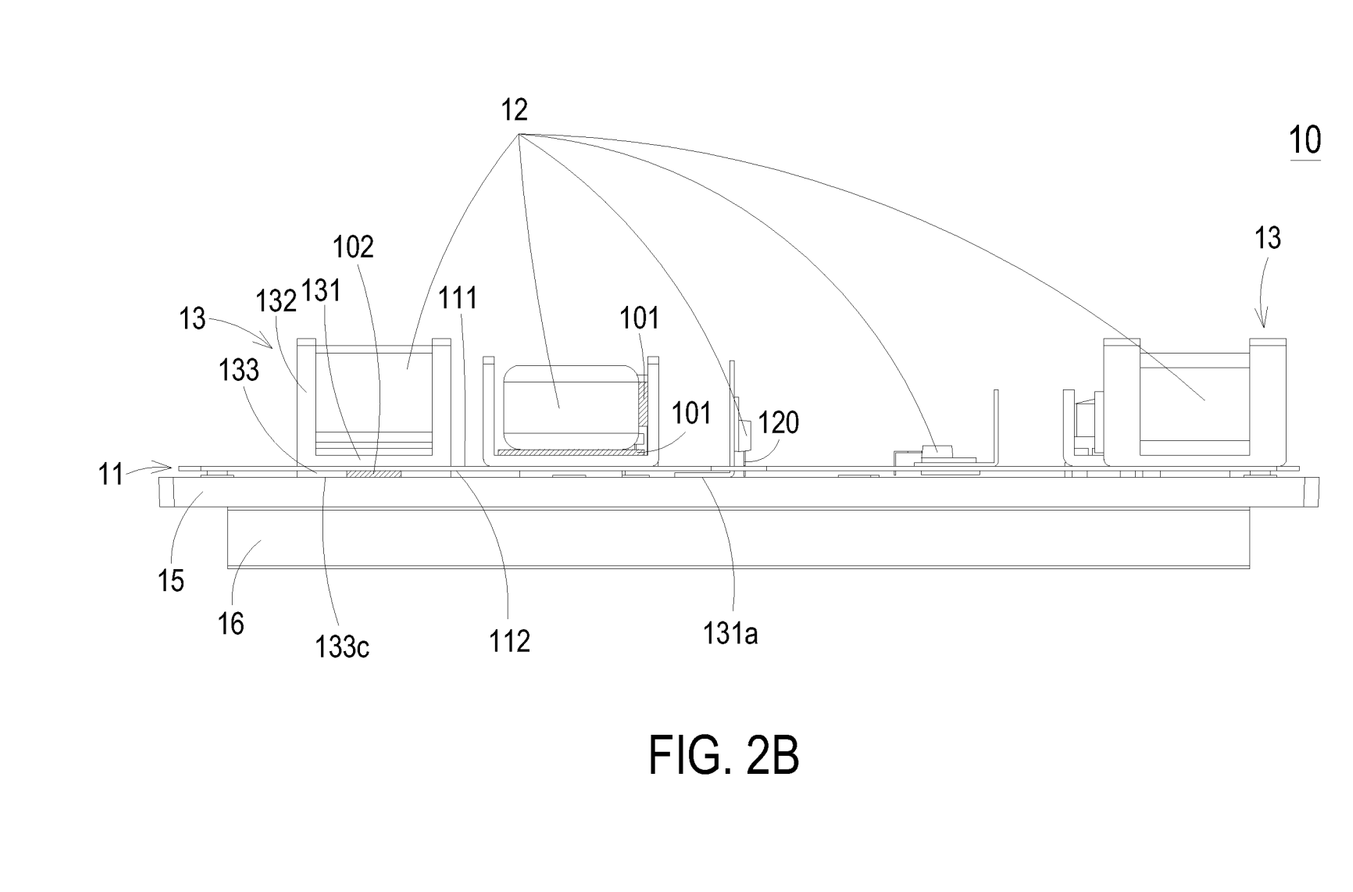
FIG. 2B is a schematic side view illustrating the heat-dissipating module of the electronic device of the present invention.

FIG. 2B is a schematic side view illustrating the heat-dissipating module of the electronic device of the present invention. After the heat-generating elements 12 are disposed on corresponding heat-conducting elements 13, the heat-conducting elements 13 are inserted into corresponding perforations 113 of the circuit board 11 (see FIG. 2A). In some embodiments, the bases 131 of the heat-conducting elements 13 are in contact with first surface 111 of the circuit board 11, but the extension parts 133 are inserted into corresponding perforations 113. The bottoms 133c of the bases 131 of the heat-conducting elements 13 are arranged at the same level with the second surface 112 of the circuit board 11, or protruded over the second surface 112 of the circuit board11. The cross-sectional area of the base 131 of the heat-conducting element 13 is greater than the cross-sectional area of the extension part 133.

In some embodiments, the bases 131 of the heat-conducting elements 13 are directly inserted into corresponding perforations 113 of the circuit board 11. The bottoms 131a of the bases 131 of the heat-conducting elements 13 are arranged at the same level with the second surface 112 of the circuit board 11, or protruded over the second surface 112 of the circuit board 11. Moreover, the profiles of the heat-conducting elements 13 may be modified according to the shapes and properties of the heat-generating elements 12.

Please refer to FIG. 2B again. In some embodiments, a first thermally-conductive and electrically-insulated layer 101 is arranged between the heat-generating element 12 and the sidewall 132 and/or base 131 of the heat-conducting element 13 for facilitating uniformly conducting the heat from the heat-generating element 12 to the heat-conducting element 13. In addition, the first thermally-conductive and electrically-insulated layer 101 can increase electrical isolation between the heat-generating element 12 and the heat-conducting element 13, thereby maintaining electrical safety of the heat-generating element 12. In some embodiments, a second thermally-conductive and electrically-insulated layer (not shown) is arranged between the base 131 of the heat-conducting element 13 and the first surface 111 of the circuit board 11 for facilitating thermal conduction between the heat-conducting element 13 and the circuit board 11. In some embodiments, a third thermally-conductive and electrically-insulated layer 102 is arranged between the second surface 112 of the circuit board 11 and the cold plate 15, or arranged between the extension part 133 of the heat-conducting element 13 and the cold plate 15. The arrangement of the third thermally-conductive and electrically-insulated layer 102 can facilitate thermal conduction between the circuit board 11 or the heat-conducting element 13 and the cold plate 15.

It is noted that the above-mentioned thermally-conductive and electrically-insulated layers may be formed by coating, filling or spraying thermal gel or attaching thermal pad, and it is not limited thereto.

Figure 2C:
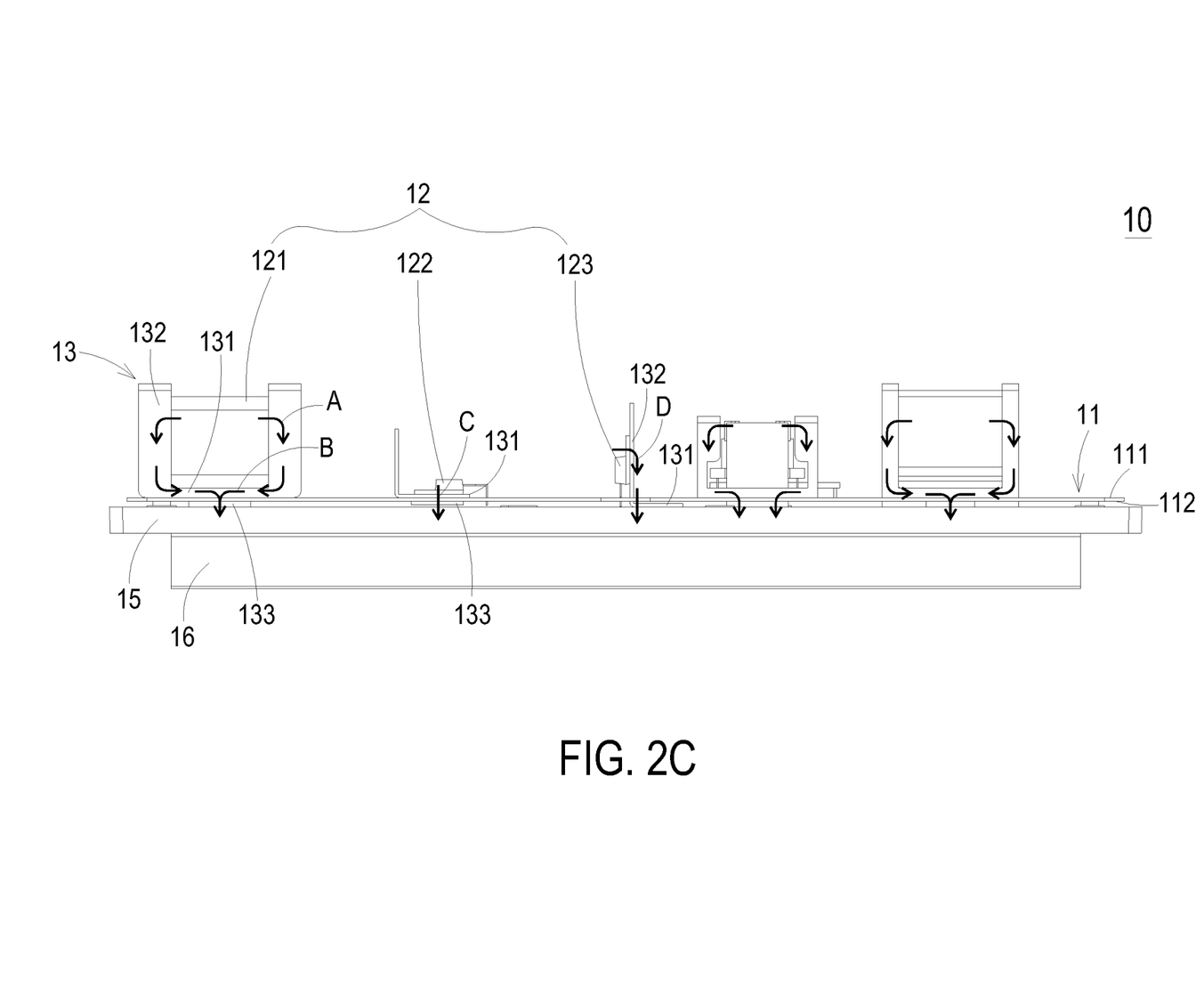
FIG. 2C is a schematic view illustrating the heat-conducting path of the heat-dissipating module of the electronic device as shown in FIG. 2B.

FIG. 2C is a schematic view illustrating the heat-conducting path of the heat-dissipating module of the electronic device as shown in FIG. 2B. The heat-generating elements 12, the heat-conducting elements 13, the circuit board 11, the cold plate 15 and the active heat-dissipating member 16 are combined together. The heat generated by the heat-generating elements 12 is transmitted to the cold plate 15 through the heat-conducting elements 13, and then the heat is dissipated away by the active heat-dissipating member 16. For example, a portion of the heat generated by the heat-generating element 121 is transmitted to the cold plate 15 through the sidewall 132 of the heat-conducting element 13 along the heat-conducting path A; and a portion of the heat generated by the heat-generating element 121 is transmitted to the cold plate 15 through the base 131 and the extension part 133 of the heat-conducting element 13 along the heat-conducting path B. Since the heat generated by the heat-generating element 121 could be effectively conducted downwardly to the cold plate 15, the temperature of the heat-generating element 121 is lowered and the environmental temperature of the sealed space 140 of the electronic device 1 is reduced.

In a case that the heat of the heat-generating element 122 is mostly generated by the lower part of the heat-generating element 122, the heat-generating element 122 may be directly disposed on the base 131 of the heat-conducting elements 13. In this situation, the heat-generating element 122 is not necessarily contacted with the sidewall 132 of the heat-conducting elements 13. As such, the heat generated by the heat-generating element 122 is transmitted to the cold plate 15 through the base 131 and the extension part 132 of the heat-conducting element 13 along the heat-conducting path C.

In a case that the heat-generating element 123 is attached on the sidewall 132 of the heat-conducting elements 13, the heat generated by the heat-generating element 123 is transmitted to the cold plate 15 through the sidewall 132 of the heat-conducting element 13 along the heat-conducting path D.

Depending on the types of the heat-generating elements 12 and the relations between the heat-generating elements 12 and the heat-conducting elements 13, the heat-conducting paths may be varied.

From the above description, the electronic device of the present invention has a heat-dissipating mechanism for conducting and dissipating heat inside the sealed device. After the heat-generating elements are disposed on corresponding heat-conducting elements, the heat-conducting elements are inserted into corresponding perforations of the circuit board. As such, the heat by the heat-generating elements is transmitted to the cold plate through the heat-conducting elements uniformly and efficiently, and then dissipated away by the active heat-dissipating member (e.g. an air-cooling member or a liquid-cooling member). As a consequence, the heat-dissipating efficiency of removing the heat of the sealed space is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating module for use in an electric device, said heat-dissipating module comprising:
    a circuit board having a first surface, a second surface and at least one perforation;
    at least one heat-generating element;
    at least one heat-conducting element disposed in said perforation, wherein said heat-conducting element comprises a base and a sidewall, and
    a first thermally-conductive and electrically-insulated layer, which is arranged between said heat-generating element and said heat-conducting element for facilitating thermal conduction between said heat-generating element and said heat-conducting element;
    wherein said heat-generating element is disposed on said base or said sidewall of said heat-conducting element so that the heat by said heat-generating element is conducted to said second surface of said circuit board through said heat-conducting element.

2. The heat-dissipating module according to claim 1, further comprising a second thermally-conductive and electrically-insulated layer, which is arranged between said base of said heat-conducting element and said circuit board for facilitating thermal conduction between said heat-conducting element and said circuit board.

3. The heat-dissipating module according to claim 1, wherein said heat-conducting element further includes at least one extension part, which is downwardly extended from said base of said heat-conducting element and inserted into said perforation.

4. The heat-dissipating module according to claim 3, wherein a bottom of said extension part is arranged at the same level with said second surface of said circuit board, or protruded over said second surface of said circuit board.

5. The heat-dissipating module according to claim 3, wherein a cross-sectional area of said base of said heat-conducting element is greater than a cross-sectional area of said extension part.

6. The heat-dissipating module according to claim 3, wherein a cross-sectional area of said extension part is substantially equal to an area of said corresponding perforation.

7. The heat-dissipating module according to claim 3, wherein said sidewall, said base and said extension part are integrated into said heat-conducting element.

8. The heat-dissipating module according to claim 1, wherein plural apertures are formed in said base of said heat-conducting element, and said heat-generating element has a plurality of pins, which are penetrated through corresponding apertures.

9. The heat-dissipating module according to claim 1, wherein said heat-generating element include a transformer, an inductor, a capacitor, a transistor or a filter.

10. An electric device, disposed in a sealed accommodating space, said electric device comprising:
    a casing;
    a heat-dissipating module comprising:
        a circuit board disposed in said casing and having a first surface, a second surface and at least one perforation;

at least one heat-generating element; and at least one heat-conducting element disposed in said perforation, wherein said heat-conducting element comprises a base and a sidewall;

a first thermally-conductive and electrically-insulated layer, which is arranged between said heat-generating element and said heat-conducting element for facilitating thermal conduction between said heat-generating element and said heat-conducting element; and a cold plate disposed under said circuit board;

wherein said heat-generating element is disposed on said base or said sidewall of said heat-conducting element so that the heat by said heat-generating element is transmitted to said cold plate through said heat-conducting element.

11. The electric device according to claim 10, wherein said casing and said cold plate are combined together to define a sealed space.

12. The electric device according to claim 10, further comprising a third thermally-conductive and electrically-insulated layer, which is arranged between said circuit board or said heat-conducting element and said cold plate for facilitating thermal conduction between said circuit board or said heat-conducting element and said cold plate.

13. The electric device according to claim 10, wherein said cold plate and said heat-conducting element are made of a material with relatively high thermal conductivity.

14. The electric device according to claim 10, further comprising an active heat-dissipating member under said cold plate, wherein the heat by said heat-generating element is transmitted from said cold plate to said active heat-dissipating member, and dissipated away by said active heat-dissipating member.

15. The electric device according to claim 14, wherein said active heat-dissipating member is an air-cooling member or a liquid-cooling member.

16. The electric device according to claim 14 wherein said active heat-dissipating member and said cold plate are integrally formed.

17. The electric device according to claim 10, wherein said heat-conducting element further includes at least one extension part, which is downwardly extended from said base of said heat-conducting element and inserted into said perforation.

18. The electric device according to claim 10, wherein plural apertures are formed in said base of said heat-conducting element, and said heat-generating element has a plurality of pins, which are penetrated through corresponding apertures.

19. The electric device according to claim 10, wherein said heat-dissipating module further comprises:

a second thermally-conductive and electrically-insulated layer, which is arranged between said base of said heat-conducting element and said circuit board for facilitating thermal conduction between said heat-conducting element and said circuit board.

* * * * *